(12) United States Patent
Chen et al.

(10) Patent No.: US 10,928,047 B2
(45) Date of Patent: Feb. 23, 2021

(54) PACKAGE STRUCTURE AND LED ILLUMINATION MODULE

(71) Applicant: SILERGY SEMICONDUCTOR TECHNOLOGY (HANGZHOU) LTD, Zhejiang (CN)

(72) Inventors: Wei Chen, Zhejiang (CN); Jian Wei, Zhejiang (CN)

(73) Assignee: SILERGY SEMICONDUCTOR TECHNOLOGY (HANGZHOU) LTD, Zhejiang (CN)

( * ) Notice: Subject to any disclaimer, the term of this patent is extended or adjusted under 35 U.S.C. 154(b) by 0 days.

(21) Appl. No.: 16/366,241

(22) Filed: Mar. 27, 2019

(65) Prior Publication Data

US 2019/0301715 A1    Oct. 3, 2019

(30) Foreign Application Priority Data

Apr. 3, 2018    (CN) .......................... 201810289555.0

(51) Int. Cl.
| | |
|---|---|
| *H01L 25/16* | (2006.01) |
| *F21V 23/00* | (2015.01) |
| *H01L 25/075* | (2006.01) |
| *H05B 45/37* | (2020.01) |
| *F21Y 115/10* | (2016.01) |
| *H02M 3/335* | (2006.01) |

(52) U.S. Cl.
CPC ........ *F21V 23/005* (2013.01); *H01L 25/0753* (2013.01); *H01L 25/167* (2013.01); *H05B 45/37* (2020.01); *F21Y 2115/10* (2016.08); *H02M 3/33523* (2013.01); *Y02B 20/30* (2013.01)

(58) Field of Classification Search
CPC ..................................................... H01L 25/167
See application file for complete search history.

(56) References Cited

U.S. PATENT DOCUMENTS

| | | | |
|---|---|---|---|
| 2013/0069156 A1* | 3/2013 | Miura | ............... H01L 29/78615 257/335 |
| 2016/0366780 A1* | 12/2016 | Liang | ................... H01R 12/585 |
| 2017/0133355 A1* | 5/2017 | Chen | ..................... H01L 23/495 |
| 2019/0297784 A1* | 10/2019 | Hegde | ................... H05B 45/00 |

* cited by examiner

*Primary Examiner* — Peniel M Gumedzoe
*Assistant Examiner* — Christopher A Johnson
(74) *Attorney, Agent, or Firm* — Harness, Dickey & Pierce, P.L.C.

(57) ABSTRACT

A package for a power supply circuit and an LED illumination module are provided. The package includes: a first package body, configured to package a power device, a control chip and a passive element; an inductive element; a connector configured to connect an electrode of the inductive element to a corresponding electrode of the power device; an encapsulant configured to encapsulate the first package body, the inductive element and the connector; and multiple pins exposed through the encapsulant and configured to achieve external electrical connection. In the package, the control chip, the inductive element and the passive element are packaged together, thereby reducing an area occupied by the drive circuit in the LED illumination module.

14 Claims, 5 Drawing Sheets

PACKAGE STRUCTURE AND LED ILLUMINATION MODULE

The present application claims priority to Chinese Patent Application No. 201810289555.0, titled "PACKAGE STRUCTURE AND LED ILLUMINATION MODULE", filed on Apr. 3, 2018 with the Chinese Patent Office, which is incorporated herein by reference in its entirety.

FIELD

The present disclosure relates to the field of Light Emitting Diode (LED) illumination, and in particular to a package structure of a power supply circuit and an LED illumination module.

BACKGROUND

Light Emitting Diodes (LEDs) are widely used due to features of energy saving, environmental protection, long service life and no strobe. A conventional LED illumination module generally includes a lamp base, a lamp body and a photoelectric structure. The photoelectric structure includes an LED light source and a power supply circuit for driving the LED light source. The LED light source includes a lamp board and multiple LEDs attached to the light board. The power supply circuit includes a drive chip and peripheral elements. In order to reduce the number of components and the cost for assembling the components, and reduce the assembly cost of the module, optical components and electrical components are integrated in the conventional LED illumination module. That is, the LED light source and the drive circuit are arranged on the same substrate. In this structure, capacitors, resistors, diodes, inductors, and the drive chip are mounted on a front surface of a metal printed circuit board (PCB) in the form of Surface Mounted Devices (SMD).

With increasing demands on miniaturization, light-weight and high efficiency of the LED illumination module, it is required to integrate more components in the LED illumination module while reducing the size of the LED illumination module. Therefore, it is required to improve the conventional LED illumination module to minimize an area occupied by the drive circuit in the LED illumination module, so as to improve the illumination efficiency of the LED illumination module.

SUMMARY

In view of this, an object of the present disclosure is to provide a package structure of a power circuit and an LED illumination module so as to further reduce an area of the power circuit and improve the illumination efficiency of the LED illumination module.

According to an aspect of the present disclosure, a package structure of a power circuit is provided, which includes: a first package body configured to package a power device, a control chip and a passive element; an inductive element; a connector, configured to connect an electrode of the inductive element to a corresponding electrode of the power device; an encapsulant, configured to encapsulate the first package body, the inductive element and the connector; and multiple pins, exposed through the encapsulant and configured to achieve external electrical connection.

In one embodiment, the inductive element is arranged above the first package body, or the first package body and the inductive element are arranged side by side.

In one embodiment, the connector is a bonding wire or a metal bump.

In one embodiment, the first package body is spaced from the inductive element by a predetermined distance.

In one embodiment, the inductive element is one of an inductor and a transformer.

In one embodiment, the passive element is at least one of a resistor, a capacitor and a diode.

In one embodiment, the power device and the control chip are integrated in a single chip.

In one embodiment, the inductive element, the power device, the control chip and the passive element form a switch converter.

In one embodiment, the switch converter is configured to receive an input voltage and to connect a ground via the multiple pins.

In one embodiment, the switch converter is an isolated switch converter, the multiple pins includes a first ground pin and a second ground pin, and the first ground pin is spaced from the second ground pin by a distance greater than a predetermined electrical distance.

In one embodiment, the first ground pin and the second ground pin are arranged on different side surfaces of the package structure.

In one embodiment, the first package body has a first surface and a second surface opposite to each other, wherein the first surface is provided with multiple pads, the multiple pins are provided on the second surface, the inductive element is electrically connected to the multiple pads on the first surface.

In one embodiment, at least one of the multiple pads is connected to at least one of the multiple pins via a conductive channel within the first package body, to provide a conductive path from the first surface to the second surface.

In one embodiment, at least one of the multiple pads is configured to withstand a high voltage, and the encapsulant covers the multiple pads.

According to another aspect of the present disclosure, an LED illumination module is provided, which includes: a printed circuit board; the package structure according to any one of the above embodiment; and multiple LED s. The package and the multiple LEDs are arranged on the printed circuit board, and the package structure is connected to the multiple LEDs via the printed circuit board.

In one embodiment, a surface of the printed circuit board is provided with an aluminum foil, and the multiple LEDs are arranged on the surface provided with the aluminum foil.

according to the LED illumination module and the package structure of the power circuit in the present disclosure, the control chip, the inductive element and the passive element are packaged together to reduce an area occupied by the drive circuit in the LED illumination module. In a preferred embodiment, the control chip and the passive element are integrated in the first package body, the first package body is spaced from the inductive element by the predetermined distance, and first package body is electrically connected to the inductive element via the connector, so as to avoid the mutual interference between a pin of the inductive element and a pin of the control chip, and improve the safety and stability of the circuit. In addition, since the inductive element is connected to the control chip via high-voltage terminals, the high-voltage terminals are arranged in the package structure in the present disclosure, so as to prevent the interference of peak discharging of the high-voltage terminal on adjacent pins.

BRIEF DESCRIPTION OF THE DRAWINGS

With the description of embodiments of the present disclosure in conjunction with the accompanying drawings in the following, the above and other objects, features and advantages of the present disclosure are more obvious and be understood more easily.

DETAILED DESCRIPTION OF EMBODIMENTS

Figure 1:
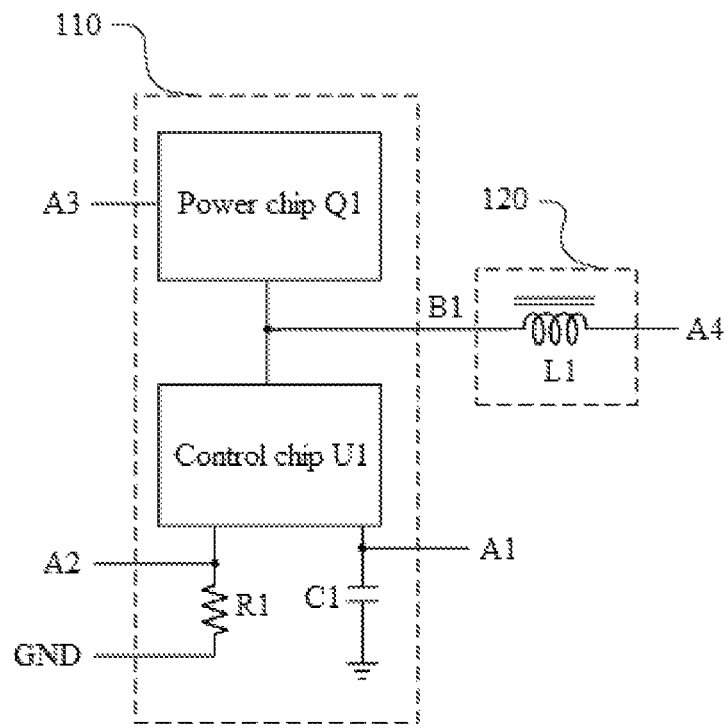
FIG. 1 is a schematic diagram of an LED drive circuit according to a first embodiment of the present disclosure.

The present disclosure is described in more detail in the following with reference to the drawings. In each attached drawing, the same elements are represented by similar graphic marks. Each of parts in the drawings is not drawn to scale for clarity. In addition, some known parts may not be shown in the drawings.

Many specific details of the present disclosure, such as a structure, a material, a size, a processing craft and a technology of a component, are described below for a clearer understanding of the present disclosure. However, as those skilled in the art can understand, the disclosure may be implemented without the following specific details.

It should be understood that in description of the structure of the component, when a layer or an area is referred to be "on" or "above" another layer or another area, it may be directly above the another layer or the another area, or other layers or areas may be included between the layer or the area and the another layer or the another area. And, if the component is flipped, the layer or the area may be located above or below the another layer or the another area.

It should be understood that when an element is "coupled" or "connected" to another element, it may be directly coupled or connected to the another element or an intermediate element may exist between the element and the anther element. The elements may be connected to each other physically, logically, or in a combination manner. Conversely, if an element is "directly coupled" or "directly connected" to another element, it indicates that there is no intermediate element between the both.

Many specific details of the present disclosure, such as a structure, a material, a size, a processing craft and a technology, are described below for a clearer understanding of this disclosure. As those skilled in the art can understand, this disclosure can be implemented without the following specific details.

FIG. 1 is a schematic diagram of an LED drive circuit according to a first embodiment of the present disclosure. An LED drive circuit 100 includes a control chip U1, a power chip Q1, an inductor L1, a first resistor R1 and a first capacitor C1. The LED drive circuit 100 further includes pins A1-A4, a pin B1 and a ground pin GND.

As shown in FIG. 1, the pin A3 is connected to the power chip Q1, the control chip U1 is connected to the power chip Q1, a drive circuit is integrated in the control chip U1 and configured to provide a switch control signal for the power chip Q1. The power chip Q1 may be realized by, for example, a power transistor. The pin B1 is led out from an intermediate node between the power chip Q1 and the control chip U1, and is connected to a first terminal of the inductor L1, and a second terminal of the inductor L1 is connected to the pin A4. A first resistor R1 is connected in series between the control chip U1 and the ground pin GND, and the pin A2 is connected to an intermediate node between the control chip U1 and the first resistor R1. The first capacitor C1 is connected in series between the control chip U1 and the ground. In addition, an intermediate node between the first capacitor C1 and the control chip U1 is connected to the pin A1.

The pins A3, A4 and B1 are high-voltage pins for connecting to a high voltage such as 500V, and the pins A1 and A2 are low-voltage pins for connecting to a low voltage such as 20V. In an embodiment of the present disclosure, the control chip U1, the power chip Q1, the first resistor R1 and the first capacitor C1 are packaged in an integrated circuit module to form a first package body 110.

Figure 2:
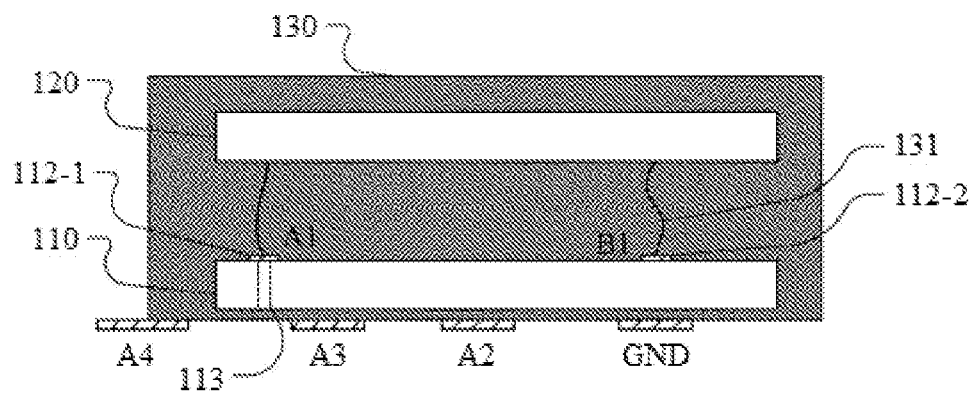
FIG. 2 is a front view illustrating a package structure of an LED drive circuit according to a first embodiment of the present disclosure.
Figure 3:
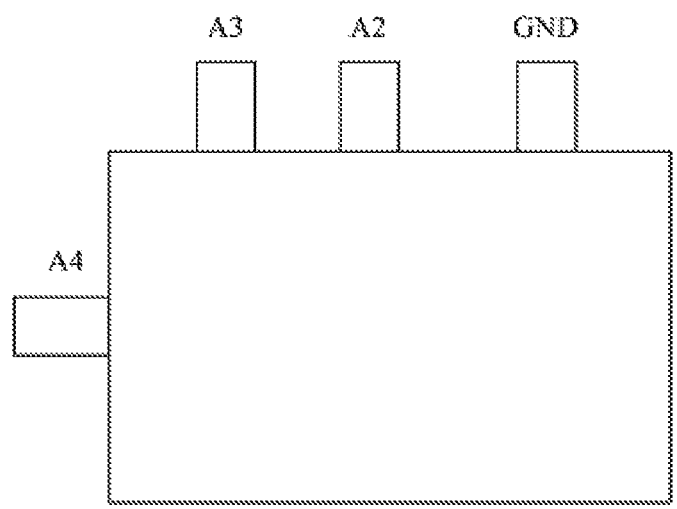
FIG. 3 is a top view illustrating a package structure of an LED drive circuit according to a first embodiment of the present disclosure.

FIG. 2 and FIG. 3 are a front view and a top view illustrating the package structure of an LED drive circuit according to the first embodiment of the present disclosure respectively. The control chip U1, the power chip Q1, the first resistor R1 and the first capacitor C1 shown in FIG. 1 are integrated in the first package body 110. An inductive element 120 includes the inductor L1 shown in FIG. 1. As shown in FIGS. 2 and 3, the first package body 110 and the inductive element 120 are arranged opposite to each other. In other embodiments of the present disclosure, the first package body 110 and the inductive element 120 are arranged side by side. A first surface of the first package body 110 (such as an upper surface of the first package body 110) is provided with multiple pads 112, and a second surface (such as a lower surface of the first package body 110) is provided with the pins A2-A4 and the ground pin GND. The multiple pads 112 are configured to be connected to the pins for connection to internal components in the first package body 110. For example, the pins A1 and B1 are connected to a first pad 112-1 and a second pad 112-2 respectively. In addition, a conductive channel 113 is provided in the first package body 110. At least one of the multiple pads 112 is connected to at least one of the multiple pins via the conductive channel 113 in the first package body 110 so as to provide a conductive path from the first surface of the first package body 110 to the second surface of the first package body 110.

The inductive element 120 is connected to the multiple pads 112 of the first package body 110 via multiple connectors 131. In one embodiment, electrodes of the inductive element are connected to corresponding electrodes of the power device via multiple connectors 131. In some embodiments of the present disclosure, the inductive element 120 is connected to the multiple pads 112 via bonding wires. In other embodiments, the inductive element 120 may also be connected to the multiple pads 112 via conductive bumps, which is not limited in the present disclosure and may be selected by those skilled in the art based on specific conditions.

In addition, the package further includes an encapsulant 130, which covers the first package body 110 and the inductive element 120, and end portions and/or bottom portions of the multiple pins are exposed through the encapsulant 130 to provide electrical connection between the integrated circuit module and an external circuit such as a circuit board. In a preferred embodiment, the encapsulant 130 is filled between the first package body 110 and the inductive element 120 to space the first package body 110 from the inductive element 120 by a predetermined distance.

In other embodiments of the present disclosure, the inductive element 120 is arranged on the first surface of the first package body 110 (such as the upper surface of the first package body 110). The control chip U1, the power chip Q1, the first resistor R1 and the first capacitor C1 integrated in the first package body 110 are arranged at a position having a predetermined distance from the first surface of the first package body 110.

Figure 4:
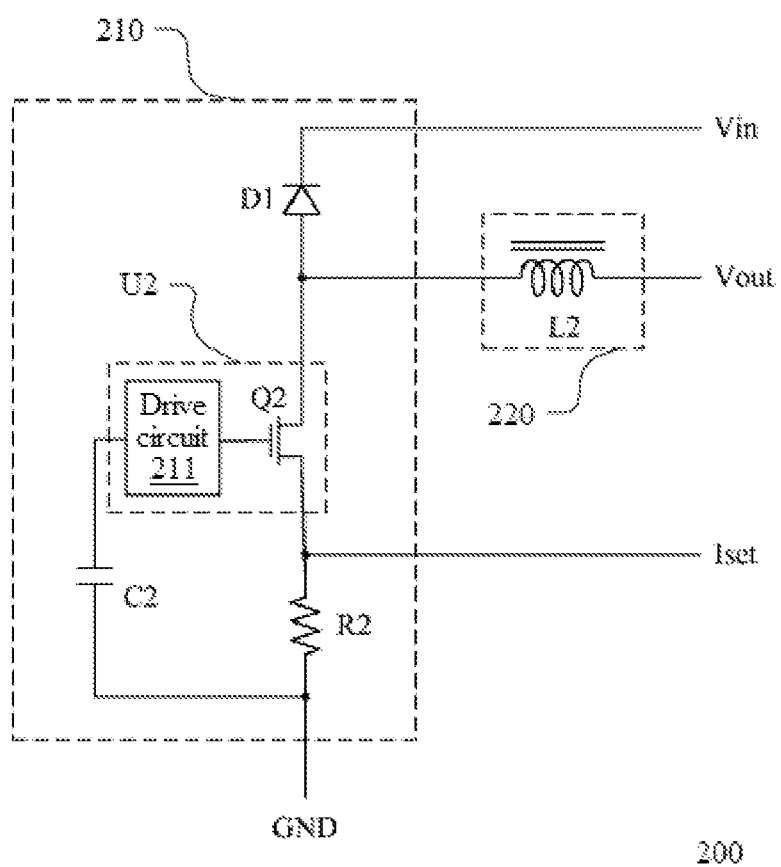
FIG. 4 is a schematic diagram of an LED drive circuit according to a second embodiment of the present disclosure.

FIG. 4 is a schematic diagram of an LED drive circuit according to a second embodiment of the present disclosure. The LED drive circuit 200 includes a control chip U2, an inductor L2, a first diode D1, a second resistor R2 and a second capacitor C2, which form a switch converter.

A power transistor Q2 and a drive circuit 211 are integrated in the control chip U2. The power transistor Q2 has a control electrode, a first electrode and a second electrode. The control electrode of the power transistor Q2 is connected to the drive circuit 211. In addition, the first diode D1, the power transistor Q2 and the second resistor R2 are connected in series between an input pin Vin and a ground pin GND. A cathode of the first diode D1 is connected to the input pin Vin, and an anode of the first diode D1 is connected to the first electrode of the power transistor Q2. A first terminal of the inductor L2 is connected to an intermediate node between the anode of the first diode D1 and the power transistor Q2, and a second terminal of the inductor L2 is connected to an output pin Vout. A first terminal of the second capacitor C2 is connected to the drive circuit 211, and a second terminal of the second capacitor C2 is connected to the ground pin GND to provide a power supply voltage to the control chip U2. The LED drive circuit 200 further includes a setting pin Iset, which is electrically connected to an intermediate node between the power transistor Q2 and the second resistor R2 so as to achieve setting of a preset output current.

In the second embodiment of the present disclosure, the control chip U2, the first diode D1, the second resistor R2, and the second capacitor C2 are integrated in the first package body 210. The inductor L2 may be an independent element or may be packaged in an inductive element package structure 220.

Figure 5:
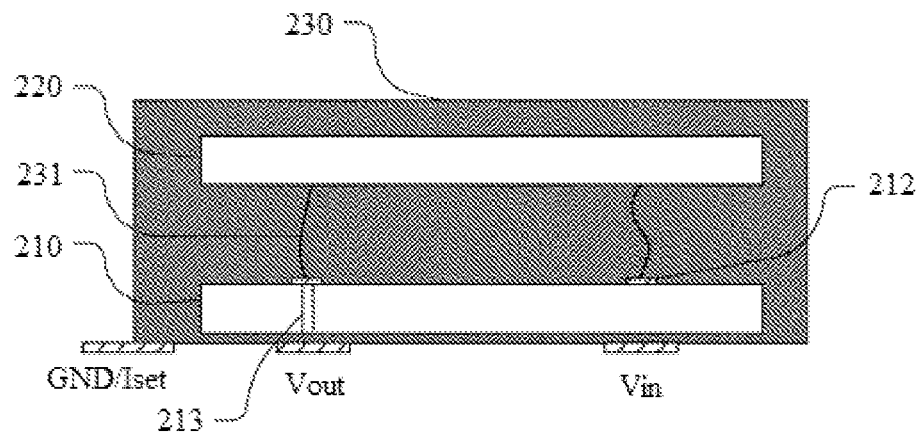
FIG. 5 is front view illustrating a package structure of an LED drive circuit according to a second embodiment of the present disclosure.
Figure 6:
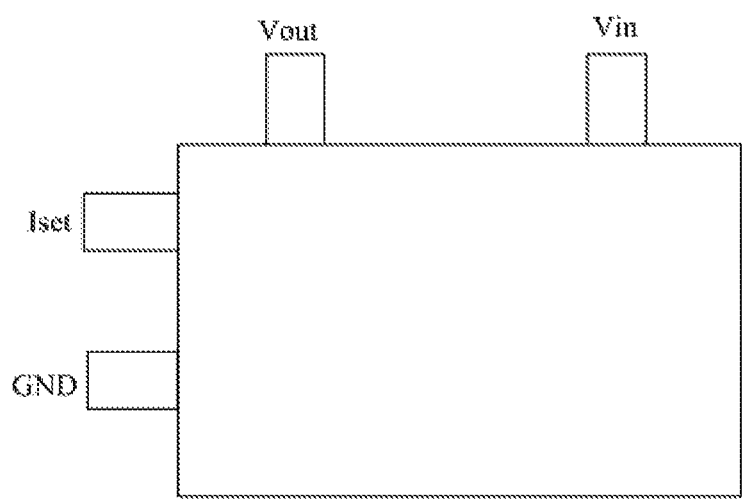
FIG. 6 is a top view illustrating a package structure of an LED drive circuit according to a second embodiment of the present disclosure.

FIG. 5 and FIG. 6 are a front view and a top view illustrating a package structure of an LED drive circuit according to the second embodiment of the present disclosure respectively. As shown in FIGS. 5 and 6, the first package body 210 and the inductive element 220 are arranged opposite to each other. A first surface of the first package body 210 (such as an upper surface of the first package body 210) is provided with multiple pads 212, and a second surface of the first package body 210 (such as a lower surface of the first package body 210) is provided with multiple pins including an input pin Vin, an output pin Vout, a setting pin Iset and a ground pin GND. The multiple pads 212 are configured to be connected to the pins for connection to internal components in the first package body 210. In addition, a conductive channel 213 is provided in the first package 210. At least one of the multiple pads 112 is connected to at least one of the multiple pins via the conductive channel 213 in the first package body 210, so as to provide a conductive path from the first surface of the first package body 210 to the second surface of the first package body 210. As shown in FIGS. 5 and 6, one of the multiple pads 212 is connected to the output pin Vout via the conductive channel 213.

The inductive element 220 is connected to the multiple pads 212 of the first package body via the multiple connectors 231. In one embodiment, electrodes of the inductive element 220 are connected to corresponding electrodes of power transistor Q2 via multiple connectors 131. The multiple connectors 231 may be bonding wires or conductive bumps, which are not limited in the present disclosure and may be selected by those skilled in the art based on the specific conditions.

In addition, the package structure further includes an encapsulant 230, which covers the first package body 210 and the inductive element 220, and an end and/or a bottom of each of the multiple pins is exposed through the encapsulant 230 to provide electrical connection between the integrated circuit module and an external circuit (such as a circuit board). In a preferred embodiment, the encapsulant 230 is filled between the first package body 210 and the inductive element 220 to space the first package body 210 from the inductive element 220 by a predetermined distance.

In other embodiments of the present disclosure, the inductive element 220 is arranged on the first surface of the first package body 210 (such as the upper surface of the first package body 210). The control chip U2, the first diode D1, the second resistor R2, and the second capacitor C2 integrated in the first package body 210 are arranged at a position having a predetermined distance from the first surface of the first package body 210.

Figure 7:
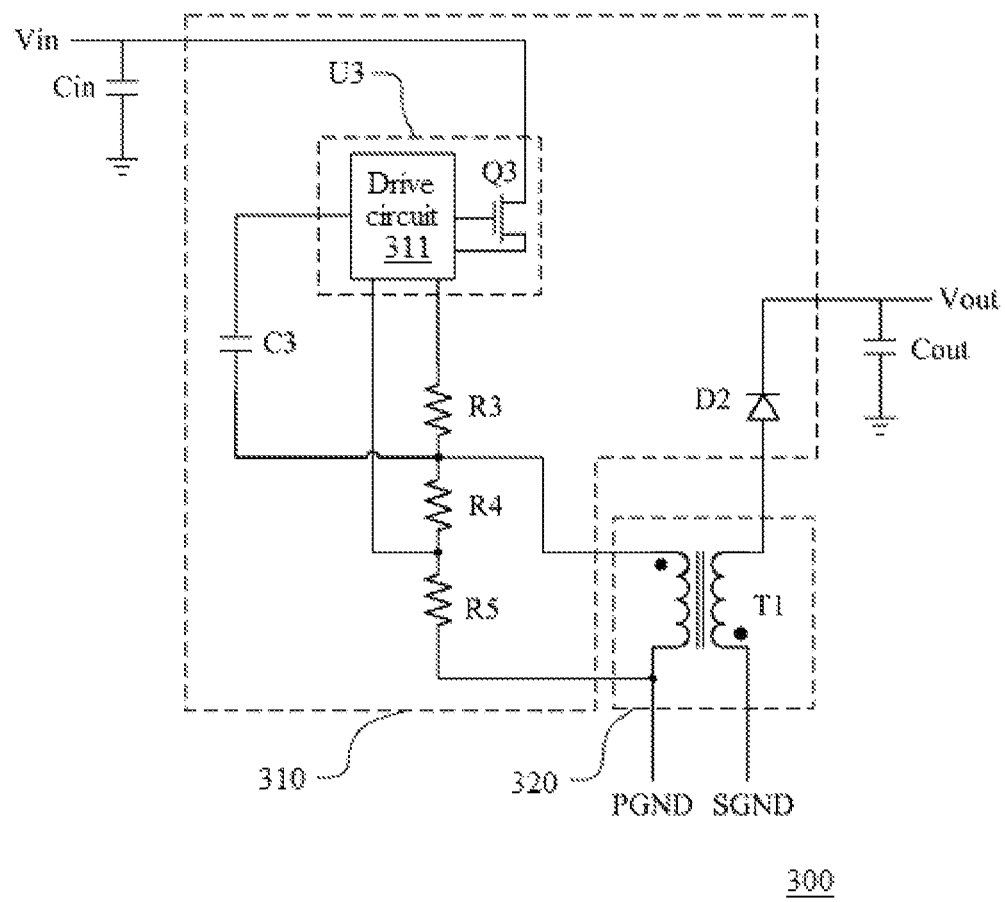
FIG. 7 is a schematic diagram of an LED drive circuit according to a third embodiment of the present disclosure.

FIG. 7 is a schematic diagram of an LED drive circuit according to a third embodiment of the present disclosure. As shown in FIG. 7, the LED drive circuit 300 includes a control chip U3, a transformer T1, a second diode D2, a third capacitor C3 and a third to a fifth resistor R3-R5 to form a topology structure of a flyback switch converter.

A drive circuit 311 and a power transistor Q3 is integrated in the control chip U3. The power transistor Q3 includes a control electrode, a first electrode and a second electrode. The first electrode of the power transistor Q3 is connected to an input pin Vin, and the control electrode and the second electrode of the power transistor Q3 are connected to the drive circuit 311. The drive circuit 311 may include another power transistor connected in series with the power transistor Q3.

A primary winding of the transformer T1 and the third resistor R3 are connected in series between the drive circuit 311 and a first ground pin PGND. The second diode D2 and a secondary winding of the transformer T1 are connected in series between an output pin Vout and a second ground pin SGND. The third resistor R3 is used for detecting a primary current. The fourth resistor R4 and the fifth resistor R5 are connected in series between two terminals of the primary winding of the transformer T1, and an intermediate node between the fourth resistor R4 and the fifth resistor R5 is connected to the drive circuit 311. The fourth resistor R4 and the fifth resistor R5 form a resistive voltage dividing circuit to implement voltage feedback so as to detect a primary voltage or a secondary voltage. In addition, the third capacitor C3 is connected in series between the drive circuit 311 and an intermediate node between the third resistor R3 and the primary winding to provide a power supply for the control chip U3.

The LED drive circuit 300 further includes an input capacitor Cin and an output capacitor Cout. The input capacitor Cin is connected in series between an input pin Vin and ground, and the output capacitor Cout is connected in series between an output pin Vout and ground.

In the third embodiment of the present disclosure, the control chip U3, the second diode D2, the third capacitor C3 and the third to the fifth resistors R3-R5 are integrated in the first package body 310, and the transformer T1 is integrated in the inductive element 320.

Figure 8:
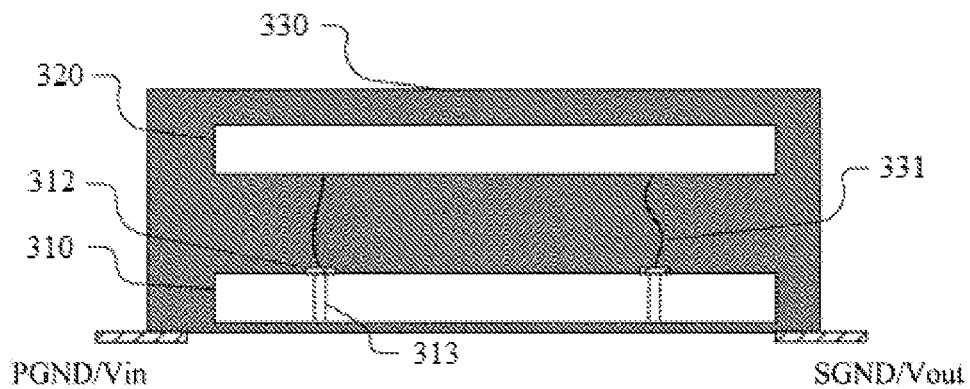
FIG. 8 is a front view illustrating a package structure of an LED drive circuit according to a third embodiment of the present disclosure.
Figure 9:
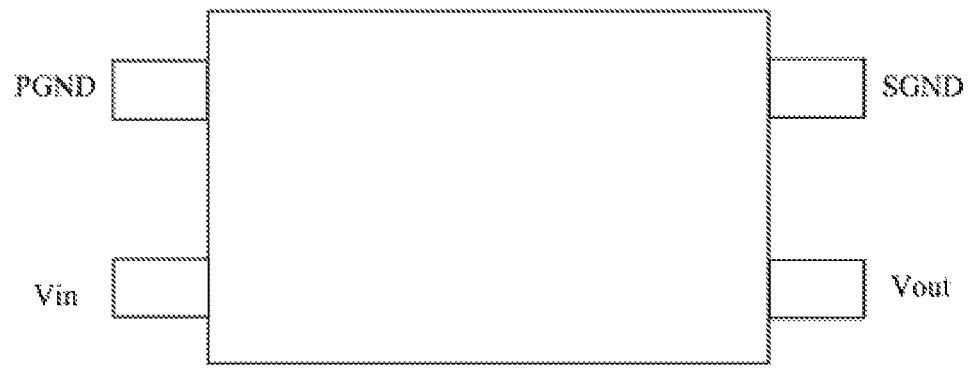
FIG. 9 is a top view illustrating a package structure of an LED drive circuit according to a third embodiment of the present disclosure.

FIG. 8 and FIG. 9 are a front view and a top view illustrating a package structure of an LED drive circuit according to the third embodiment of the present disclosure respectively. As shown in FIGS. 8 and 9, the first package body 310 and the inductive element 320 are arranged opposite to each other. A first surface of the first package body 310 (such as an upper surface of the first package body 310) is provided with multiple pads 312, and a second surface of the first package body 310 (such as a lower surface of the first package body 310) is provided with multiple pins including an input pin Vin, an output pin Vout, a first ground pin PGND and a second ground pin SGND. As shown in FIG. 8 and FIG. 9, the first package body 310 has a cuboid shape. The input pin Vin and the first ground pin PGND are arranged on a first side surface of the package structure, and the output pin Vout and the second ground pin SGND are arranged on a second side surface of the package structure opposite to the first side surface, such that the first ground pin PGND is spaced from the second ground pin SGND by a predetermined electrical distance.

The multiple pads 312 are configured to be connected to the pins for connection to internal components in the first package body 310. In addition, a conductive channel 313 is provided in the first package body 310. At least one of the multiple pads 312 is connected to at least one of the multiple pins via the conductive channel 313 in the first package body 310 to provide a conductive path from the first surface of the first package body 310 to the second surface of the first package body 310.

The inductive element 320 is connected to the multiple pads 312 of the first package body via multiple connectors 331. In one embodiment, electrodes of the inductive element 320 are connected to corresponding electrodes of power transistor Q3 via multiple connectors 131. The multiple connectors 331 may be bonding wires or conductive bumps, which are not limited in the present disclosure and may be selected by those skilled in the art based on the specific conditions.

In addition, the package structure further includes an encapsulant 330, which covers the first package body 310 and the inductive element 320, and an end and/or a bottom of each of multiple pins is exposed through the encapsulant 330 and configured to provide electrical connection between the integrated circuit module and an external circuit (such as a circuit board). In a preferred embodiment, the encapsulant 330 is filled between the first package body 310 and the inductive element 320, to space the first package body 310 from the inductive element 320 by a predetermined distance.

In other embodiments of the present disclosure, the inductive element 320 is arranged on the first surface of the first package body 310 (such as the upper surface of the first package body 310). The control chip U3, the second diode D2, the third capacitor C3, and the third to the fifth resistors R3-R5 integrated in the first package body 310 are arranged at a position having a predetermined distance from the first surface of the first package body 310.

Figure 10:
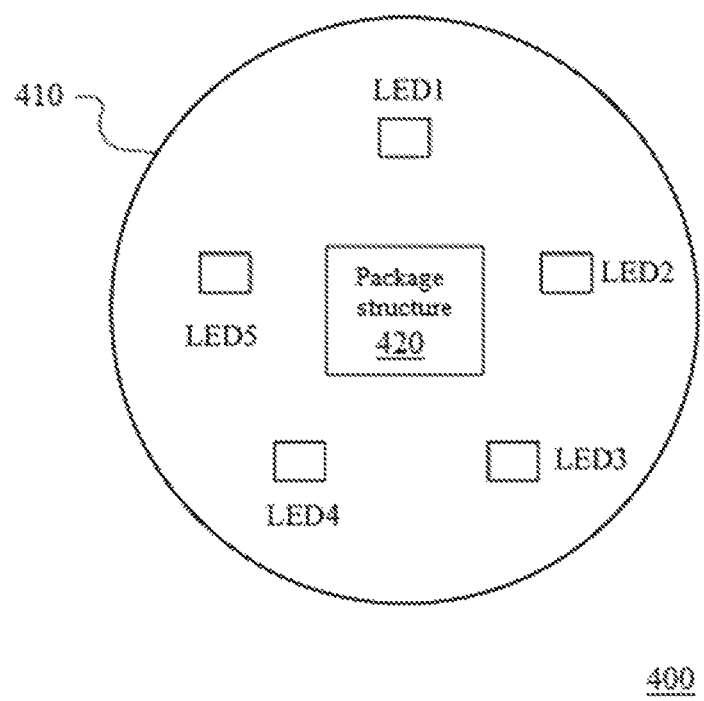
FIG. 10 is a schematic structural diagram of an LED illumination module according to a fourth embodiment of the present disclosure.

FIG. 10 is a schematic structural diagram of an LED illumination module according to a fourth embodiment of the present disclosure. As shown in FIG. 10, an LED illumination module 400 includes a printed circuit board 410, a package structure 420 and multiple LEDs LED1-LED5. The package structure 420 and the multiple LEDs LED1-LED5 are arranged on the printed circuit board 410, and the package structure 420 is connected to the multiple LEDs LED1-LED5 via the printed circuit board 410. The package structure 420 may be the package structure according to the above first to third embodiments. In a preferred embodiment, a surface of the printed circuit board 410 is provided with an aluminum foil, and the multiple LEDs LED1-LED5 are arranged on the aluminum foil.

From the above, according to the LED illumination module and the package structure of the LED drive circuit provided in the present disclosure, the control chip, the inductive element and the passive element are packaged together to reduce an area occupied by the drive circuit in the LED illumination module. In a preferred embodiment, the control chip and the passive element are integrated in the first package body. The inductive element may be a separated device or may be packaged in a package structure. The first package body is spaced from the inductive element by a predetermined distance, and the first package body is electrically connected to the the inductive element via the connector, so as to avoid the mutual interference between the pins of the inductive element and the pins of the control chip and improve the safety and stability of the circuit. In addition, since the inductive element is connected to the control chip via high-voltage terminals, the high-voltage terminals are arranged in the package structure in the present disclosure, so as to prevent the interference of peak discharging of the high-voltage terminal on adjacent pins.

In preferred embodiments, the inductive element may be the transformer including the primary winding and the secondary winding. The multiple pins of the package structure include a ground pin of the primary winding and a ground pin of the secondary winding. The ground pin of the primary winding and the ground pin of the secondary winding are respectively arranged on two side surfaces of the package structure and are spaced by a predetermined electrical distance, so as to withstand an isolation voltage between the primary winding of the transformer and the secondary winding of the transformer.

It should further be noted that relationship terminologies herein such as "first", "second" are only used to distinguish one entity or operation from another entity or operation, rather than necessitating or implying an actual relationship or order between the entities or operations. Furthermore, terms such as "include", "comprise" or any other variations thereof are intended to be non-exclusive. Therefore, a process, a method, an article or a device including a series of elements includes not only the elements but also other elements that are not enumerated, or further includes the elements inherent for the process, the method, the article or the device. Unless expressively limited otherwise, an element defined by the statement "comprising (including) a . . . " does not exclude the case that the process, the method, the article or the device including the element may include other similar elements.

Based on the embodiments of the present disclosure as described above, these embodiments do not describe all the details and do not limit the disclosure to the specific embodiments described above. Apparently, based on the above description, modifications can variation may be made. These embodiments are selected and described in this specification to better explain the principle and practical application of the present disclosure, in this case those skilled in the art can make good use of the present disclosure, and modification and application on the basis of the present disclosure. The present disclosure is only subject to the claims, an entire scope of the claims and the equivalent.

The invention claimed is:

1. A package structure of a power circuit, comprising:
   a first package body, configured to package a power device, a control chip and a passive element;
   an inductive element;
   a connector, configured to connect an electrode of the inductive element to a corresponding electrode of the power device;
   an encapsulant, configured to encapsulate the first package body, the inductive element and the connector; and
   a plurality of pins, exposed through the encapsulant and configured to achieve external electrical connection,
   wherein the first package body has a first surface and a second surface opposite to each other, wherein the first surface is provided with a plurality of pads, the plurality of pins are provided on the second surface, the inductive element is electrically connected to the plurality of pads on the first surface,
   wherein at least one of the plurality of pads is connected to at least one of the plurality of pins via a conductive channel within the first package body, to provide a conductive path from the first surface to the second surface.

2. The package structure according to claim 1, wherein
   the inductive element is arranged above the first package body, or
   the first package body and the inductive element are arranged side by side.

3. The package structure according to claim 1, wherein the connector is a bonding wire or a metal bump.

4. The package structure according to claim 2, wherein the first package body is spaced from the inductive element by a predetermined distance.

5. The package structure according to claim 1, wherein the inductive element is one of an inductor and a transformer.

6. The package structure according to claim 1, wherein the passive element is at least one of a resistor, a capacitor and a diode.

7. The package structure according to claim 1, wherein the power device and the control chip are integrated in a single chip.

8. The package structure according to claim 1, wherein the inductive element, the power device, the control chip and the passive element form a switch converter.

9. The package structure according to claim 8, wherein the switch converter is configured to receive an input voltage and to connect a ground via the plurality of pins.

10. The package structure according to claim 9, wherein the switch converter is an isolated switch converter, the plurality of pins comprises a first ground pin and a second ground pin, and the first ground pin is spaced from the second ground pin by a distance greater than a predetermined electrical distance.

11. The package structure according to claim 10, wherein the first ground pin and the second ground pin are arranged on different side surfaces of the package structure.

12. The package structure according to wherein at least one of the plurality of pads is configured to withstand a high voltage, and the encapsulant covers the plurality of pads.

13. An LED illumination module, comprising:
    a printed circuit board;
    the package structure according to claim 1; and
    a plurality of light emitting diodes (LEDs), wherein the package structure and the plurality of LEDs are arranged on the printed circuit board, and the package structure is connected to the plurality of LEDs via the printed circuit board.

14. The LED illumination module according to claim 13, wherein a surface of the printed circuit board is provided with an aluminum foil, and the plurality of LEDs are arranged on the surface provided with the aluminum foil.

* * * * *